US010700661B2

(12) United States Patent
Chen

(10) Patent No.: US 10,700,661 B2
(45) Date of Patent: Jun. 30, 2020

(54) SURFACE ACOUSTIC WAVE DEVICE WITH UNIDIRECTIONAL TRANSDUCER

(71) Applicant: Zhuohui Chen, Ottawa (CA)

(72) Inventor: Zhuohui Chen, Ottawa (CA)

(73) Assignee: Huawei Technologie Co., Ltd., Shenzhen (CN)

( * ) Notice: Subject to any disclaimer, the term of this patent is extended or adjusted under 35 U.S.C. 154(b) by 90 days.

(21) Appl. No.: 15/875,174

(22) Filed: Jan. 19, 2018

(65) Prior Publication Data

US 2019/0229702 A1   Jul. 25, 2019

(51) Int. Cl.
| | |
|---|---|
| H03H 9/02 | (2006.01) |
| H03H 9/64 | (2006.01) |
| H03H 9/145 | (2006.01) |
| H03H 3/08 | (2006.01) |
| G10K 11/36 | (2006.01) |

(52) U.S. Cl.
CPC ......... *H03H 9/02574* (2013.01); *G10K 11/36* (2013.01); *H03H 3/08* (2013.01); *H03H 9/14505* (2013.01); *H03H 9/6436* (2013.01); *H03H 9/6463* (2013.01)

(58) Field of Classification Search
CPC .......... H03H 9/02574; H03H 9/14505; H03H 9/6463
See application file for complete search history.

(56) References Cited

U.S. PATENT DOCUMENTS

| | | | |
|---|---|---|---|
| 6,242,844 B1 * | 6/2001 | Puttagunta | H03H 9/14505 310/313 B |
| 6,259,185 B1 | 7/2001 | Lai | |
| 6,469,598 B2 | 9/2002 | Tsuzuki et al. | |
| 6,759,788 B2 | 7/2004 | Sato et al. | |
| 2004/0200054 A1 | 10/2004 | Nakagawara et al. | |

(Continued)

FOREIGN PATENT DOCUMENTS

| | | |
|---|---|---|
| CN | 1329759 A | 1/2002 |
| CN | 1543062 A | 11/2004 |

(Continued)

OTHER PUBLICATIONS

Masao Takeuchi et al., "Floating-Electrode-Type Saw Unidirectional Transducers Using Leaky Surface Waves and Their Application to Low-Loss Filters", Electronics and Communications in Japan, Part 3, vol. 76, No. 6, 1993, pp. 99-110.

(Continued)

*Primary Examiner* — Samuel S Outten

(57) ABSTRACT

A surface acoustic wave (SAW) device is disclosed. The SAW device includes a piezoelectric layer and a transducer having a plurality of electrodes. The electrodes are aligned with respective longitudinal axes parallel to each other and perpendicular to a wave propagation direction. Each electrode includes a conductive first layer having a first thickness and a first width in the wave propagation direction; and a conductive second layer having a second thickness that is negligible compared to the first thickness. The first layer and second layer are in electrical contact with each other to provide electrical conduction over a total width of the electrode in the wave propagation direction, the total width being greater than the first width of the first layer.

21 Claims, 15 Drawing Sheets

(56) References Cited

U.S. PATENT DOCUMENTS

2004/0201306 A1    10/2004    Yamanouchi et al.
2013/0147320 A1*    6/2013    Son .................... H03H 9/173
                                                                               310/340

FOREIGN PATENT DOCUMENTS

CN          106384782 A      2/2017
CN          206272582 U      6/2017

OTHER PUBLICATIONS

K. Yamanouchi et al., "Low-Loss SAW Filters Using Thickness Difference Type of IDT on the NSPUDT Orientation Substrate", 1995 IEEE International Frequency Control Symposium, pp. 537-541.

T. Thorvaldsson et al., "Low Loss SAW Filters Utilizing the Natural Single Phase Unidirectional Transducer (NSPUDT)", IEEE 1990 Ultrasonics Symposium, pp. 43-48.

P.V. Wright, "Low-Cost High-Performance Resonator and Coupled-Resonator Design: NSPUDT and Other Innovative Structures", IEEE 43rd Annual Symposium on Frequency Control, 1989, pp. 574-587.

M. Takeuchi et al., "Low-Loss SAW Filters on NSPUDT Orientations of a Li2B4O7 Substrate", 1996 IEEE International Frequency Control Symposium, pp. 266-272.

Kazuhiko Yamanouchi et al., "New Low-Loss Surface Acoustic Wave Transducers in the UHF Range", IEEE Transactions on Ultrasonics, Ferroelectrics, and Frequency Control, vol. UFFC-34, No. 5, Sep. 1987, pp. 531-539.

Abhay Kochhar et al., "NSPUDT using c-axis tilted ScAlN Thin Film", 2015 Joint Conference of the IEEE International Frequency Control Symposium and the European Frequency and Time Forum (FCS).

Z. H. Chen et al., "Analysis of the Film Thickness Dependence of a Single-Phase Unidirectional Transducer Using the Coupling-of-Modes Theory and the Finite-Element Method", IEEE Transactions on Ultrasonics, Ferroelectrics, and Frequency Control, vol. 39, No. 1, Jan. 1992, pp. 82-94.

M. Takeuchi et al., "SAW Transducer Configurations for Reversing the Directivity of NSPUDT Substrates", 1995 IEEE Ultrasonics Symposium, pp. 17-22.

P. V. Wright, "The Natural Single-Phase Unidirectional Transducer: A New Low-Loss SAW Transducer", 1985 IEEE Ultrasonics Symposium, pp. 58-63.

Xiaoming Zhang et al., "Borophene as an extremely high capacity electrode material for Li-ion and Na-ion batteries", Nanoscale, 2016, 8, 15340-15347.

M. M. de Lima Jr. et al.,"Compact Mach-Zehnder acousto-optic modulator", Applied Physics Letters 89, 121104 (2006).

\* cited by examiner

SURFACE ACOUSTIC WAVE DEVICE WITH UNIDIRECTIONAL TRANSDUCER

FIELD

The present disclosure relates to surface acoustic wave (SAW) devices, in particular SAW devices designed for unidirectional wave propagation.

BACKGROUND

In communication systems (e.g., including both terminal and base station infrastructure), surface acoustic wave (SAW) devices, such as filters and resonators, are widely used. A SAW device may be implemented using an interdigital transducer (IDT). Typically, a SAW generated by the IDT is bidirectional. In the case of a transversal SAW filter, the SAW device has an input IDT and an output IDT. A SAW generated by the input IDT propagates bidirectionally, such that only 50% of the generated energy travels in the direction of the output IDT, with the remaining 50% being propagated away from the output IDT. Thus, the SAW filter suffers about 6 dB loss due to the bidirectionality of its transducers, with about 3 dB losses at each IDT. One way to reduce the insertion loss of a transversal SAW filter is to design the SAW filter such that a SAW generated by the input transducer propagates unidirectionally. Similarly, the output transducer should also be designed unidirectionally (in a direction opposite to the input transducer) to receive the SAW.

Single-phase unidirectional transducers (SPUDTs) have been designed to achieve this unidirectional wave propagation. Examples of SPUDTs include natural SPUDTs (NSPUDTs), floating electrode unidirectional transducers (FEUDTs), and film thickness difference type SPUDTs, among others. However, such designs have drawbacks. For example, devices using NSPUDTs rely on asymmetry of the crystal substrate (i.e., difference in acoustic wave propagation properties between the forward direction and the reverse direction) to achieve unidirectional wave propagation at the input transducer, but because the output transducer is on the same crystal substrate there is no reversal of the wave direction at the output transducer. In devices using FEUDTs, the transducer design requires narrow electrodes that are designed to have a width that corresponds to a small fraction of the operating wavelength (e.g., 1/12 of the operating wavelength). Because the smallest width of the electrodes is limited by the minimum feature size possible under practical fabrication considerations (typically about 0.2 µm), the result is that a very high operating frequency (i.e., a very short operating wavelength) may not be achievable. For devices using film thickness difference type SPUDTs, the electrode design is complicated and typically leads to difficulty in fabrication.

It would be desirable to provide a SAW device with a unidirectional transducer, without relying on asymmetry of the crystal substrate, and with a relatively straightforward fabrication process, yet achieving a very high operating frequency.

SUMMARY

In various examples described herein, a SAW device with a unidirectional transducer is described. Each electrode in the transducer includes a first layer and a second layer in electrical contact with each other. Electrical conduction is provided across both first and second layers. However, the second layer contributes negligible mechanical weight. The result is that the transduction center Tc and reflection center Rc of the electrode are spatially separated. When the transduction center Tc and reflection center Rc are offset by ⅛ of the operating wavelength λ, a SAW generated by the transducer propagates unidirectionally.

In some aspects, the present disclosure describes a SAW device including a piezoelectric layer and a transducer coupled to the piezoelectric layer. The transducer includes a plurality of electrodes. The plurality of electrodes are aligned with respective longitudinal axes parallel to each other and perpendicular to a wave propagation direction. Each electrode of the transducer includes a conductive first layer having a first thickness and a first width in the wave propagation direction; and a conductive second layer having a second thickness that is negligible compared to the first thickness. The first layer and second layer are in electrical contact with each other to provide electrical conduction over a total width of the electrode in the wave propagation direction, the total width being greater than the first width of the first layer.

In any of the preceding aspects/embodiments, the electrode may have a mass that is substantially provided only by the first layer.

In any of the preceding aspects/embodiments, the second layer may include graphene or borophene.

In any of the preceding aspects/embodiments, each electrode has a transduction center that is spatially offset from a reflection center of the electrode, and the offset between the transduction center and the reflection center of each electrode in the wave propagation direction may be equal to one-eighth of an operating wavelength of the SAW device.

In any of the preceding aspects/embodiments, the first width of the first layer may be equal to one-quarter of an operating wavelength of the SAW device.

In any of the preceding aspects/embodiments, the first width of the first layer may be equal to about 0.2 µm.

In any of the preceding aspects/embodiments, in each electrode, the first layer may at least partially overlap with the second layer, and the first layer may be spatially offset from the second layer in the wave propagation direction.

In any of the preceding aspects/embodiments, the offset between the first layer and the second layer may be equal to one-eighth of an operating wavelength of the SAW device.

In any of the preceding aspects/embodiments, the SAW device may include a high acoustic velocity layer coupled to the piezoelectric layer at a first surface of the piezoelectric layer. The at least one transducer may be positioned between the piezoelectric layer and the high acoustic velocity layer.

In any of the preceding aspects/embodiments, the SAW device may include a conductive layer coupled to a second surface of the piezoelectric layer, opposing the first surface of the piezoelectric layer.

In any of the preceding aspects/embodiments, the SAW device may include a high acoustic velocity layer coupled to the piezoelectric layer at a first surface of the piezoelectric layer. The transducer may be coupled to the piezoelectric layer at a second surface of the piezoelectric layer, opposing the first surface of the piezoelectric layer.

In any of the preceding aspects/embodiments, the SAW device may include a conductive layer coupled between the piezoelectric layer and the high acoustic velocity layer. The piezoelectric layer and the high acoustic velocity layer may be coupled to each other via the conductive layer.

In any of the preceding aspects/embodiments, the SAW device may include two transducers, including an input transducer and an output transducer. The input transducer may be configured to generate a SAW at an operating wavelength that propagates towards the output transducer in the wave propagation direction. Each electrode of the input transducer may have a reflection center that is spatially offset from a transduction center of the electrode in the wave propagation direction by one-eighth of the operating wavelength. Each electrode of the output transducer may have a reflection center that is spatially offset from a transduction center of the electrode in a direction opposite to the wave propagation direction by one-eighth of the operating wavelength.

In any of the preceding aspects/embodiments, the SAW device may include two transducers, including an input transducer and an output transducer. The input transducer may be configured to generate a SAW at an operating wavelength that propagates towards the output transducer in the wave propagation direction. The piezoelectric layer may exhibit a difference in wave propagation properties between the wave propagation direction and a direction opposite to the wave propagation direction. Each electrode of the input transducer may have a reflection center that is spatially coincident with a transduction center of the electrode. Each electrode of the output transducer may have a reflection center that is spatially offset from a transduction center of the electrode in a direction opposite to the wave propagation direction by one-half of the operating wavelength.

In some aspects, the present disclosure provides a method of fabricating a SAW device having a transducer with a plurality of electrodes, the plurality of electrodes being aligned with respective longitudinal axes parallel to each other and perpendicular to a wave propagation direction. The method includes forming a conductive first layer of an electrode on a substrate, the first layer being formed to have a first thickness and a first width in the wave propagation direction. The method also includes forming a conductive second layer of the electrode, the second layer having a second thickness that is negligible compared to the first thickness. The first and second layers are formed to be in electrical contact with each other to provide electrical conduction over a total width of the electrode, the total width being in the wave propagation direction and being greater than the first width of the first layer.

In any of the preceding aspects/embodiments, the second layer may be formed before the first layer.

In any of the preceding aspects/embodiments, the first layer may be formed before the second layer. Forming the first layer may include etching the substrate; and forming the first layer in etched portions of the substrate.

In any of the preceding aspects/embodiments, the substrate may be a high acoustic velocity layer. The method may include forming a piezoelectric layer over the electrode.

In any of the preceding aspects/embodiments, the substrate may be a piezoelectric layer.

In any of the preceding aspects/embodiments, the electrode may have a mass that is substantially provided only by the first layer.

In any of the preceding aspects/embodiments, the second layer may be formed to at least partially overlap with the first layer, and to be spatially offset from the first layer.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

In various examples, the present disclosure describes a surface acoustic wave (SAW) device in which at least one interdigital transducer (IDT) generates SAWs that propagate in only one direction (i.e., unidirectionally). The direction of wave propagation can be controlled, using appropriate design of the IDT electrodes. The disclosed example SAW devices may address one or more drawbacks of devices that use conventional single-phase unidirectional transducers (SPUDTs) (e.g., natural SPUDTs (NSPUDTs), floating electrode unidirectional transducers (FEUDTs), and film thickness difference type SPUDTs, among others).

Figure 1:
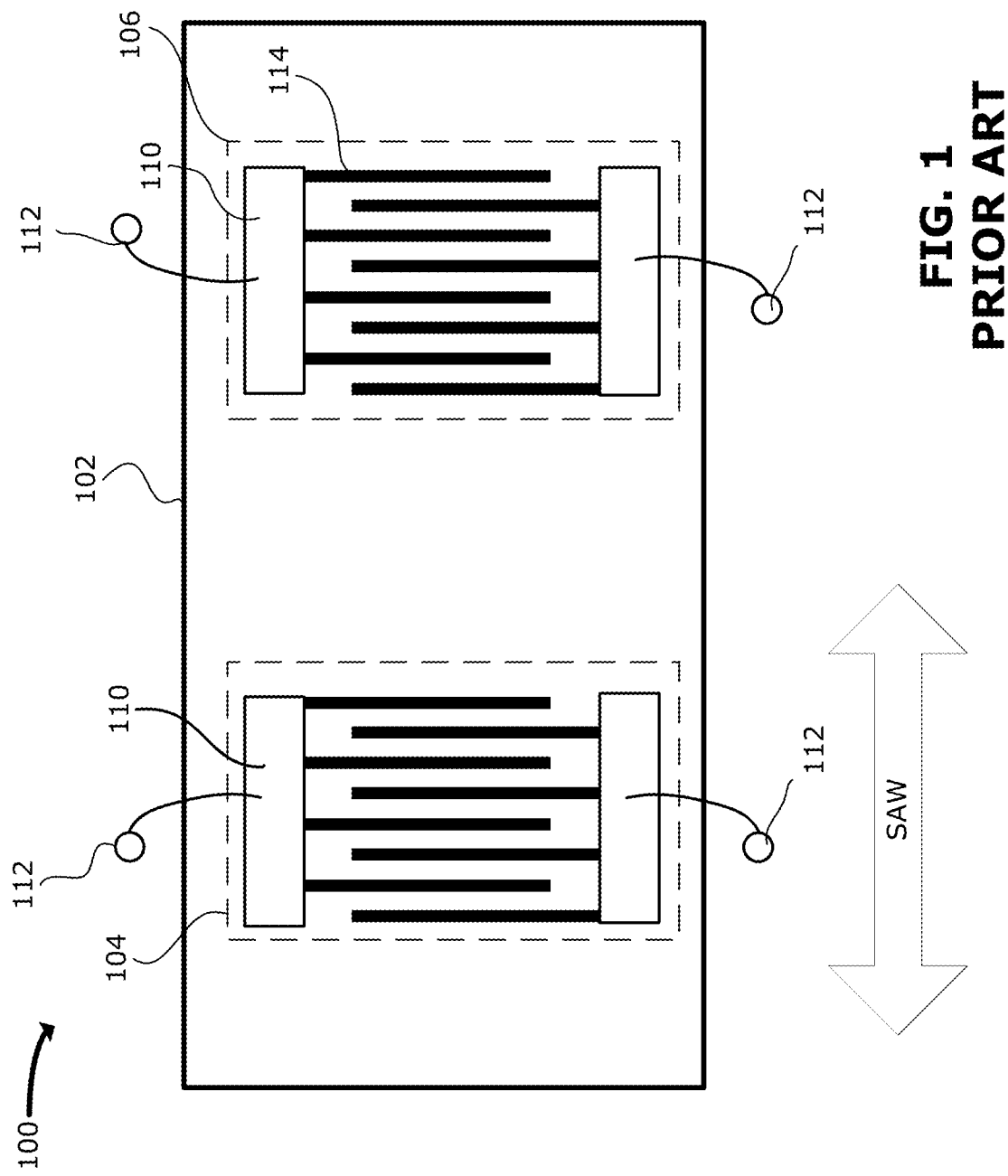
FIG. 1 is a top view of a conventional SAW device.

An example conventional SAW device 100, in this case a transversal filter, is shown in FIG. 1. The dimensions of certain features have been exaggerated for illustration purposes. For the purpose of illustration, the description below is in the context of a transversal SAW filter. However, the techniques described herein may equally apply to other types of SAW filters and/or resonators. For example, any SAW transducer, IDT, ladder-type filter, SAW-based sensors, acousto-optic Mach-Zehnder modulators or other such devices may incorporate any of the configurations and/or any suitable combination of features described herein.

The SAW device 100, which in this example embodiment is depicted as a basic filter for clarity and illustrative purposes, includes a substrate 102. An input transducer 104 and an output transducer 106 are coupled to the substrate 102, each indicated by their respective dashed box. In this example, the substrate 102 is a symmetrical substrate. In the present disclosure, a "symmetrical" substrate means that the acoustic wave propagation properties of the substrate 102 are the same in both forward (input to output) and reverse (output to input) directions.

In FIG. 1, the transducers 104, 106 are conventional bidirectional IDTs having symmetrical electrode configurations. Each of the transducers 104, 106 includes terminals 112 (e.g., a positive terminal and a grounded terminal). In the case of the input transducer 104, the terminals 112 are input terminals (e.g., positive and grounded input terminals). Similarly, for the output transducer 106, the terminals 112 are output terminals (e.g., positive and grounded output terminals). Each of the terminals 112 is coupled to respective electrodes 114 (e.g., positive electrodes and negative electrodes) via respective bonding pads 110. In each transducer 104, 106, the electrodes 114 are interlaced, in an alternating arrangement, such that each transducer 104, 106 is an IDT.

When electric power is supplied to the terminals 112 of the input transducer 104, the input transducer 104 converts the electrical signal energy into SAWs propagating bidirectionally along the substrate 102 (as indicated by the double-headed arrow). The output transducer 106 receives the portion of the generated SAWs that propagated in the direction of the output transducer 106. The portion of the generated SAWs that propagated in the opposite direction is considered lost energy. The output transducer 106 converts the received SAWs back into an electrical signal. The electrical signal is then provided at the terminals 112 of the output transducer 106. Because the input transducer 104 generates SAWs that propagate bidirectionally, at most only about 50% of the acoustic energy generated at the input transducer 104 reaches the output transducer 106. Another 50% of the energy is lost at the output transducer 106, because the output transducer 106 is also bidirectional and does not receive the SAW efficiently. As a result, the SAW device 100 has an insertion loss of at least about 6 dB.

Figure 2:
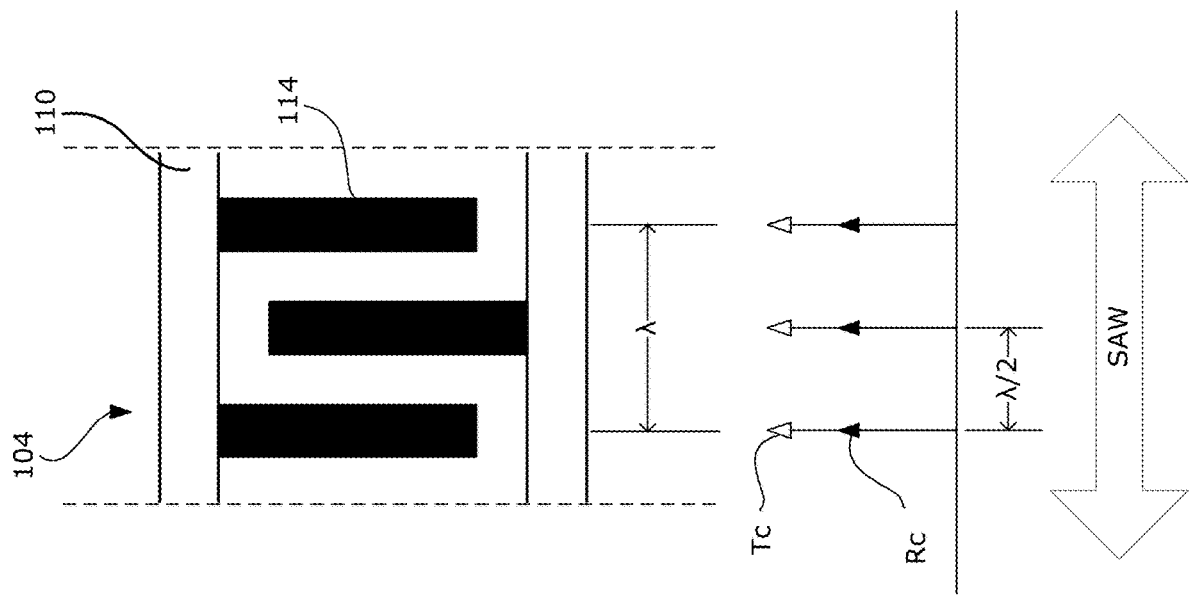
FIG. 2 illustrates the transduction center and reflection center of a bidirectional transducer.

Each electrode 114 has a transduction center Tc and a reflection center Rc, defined according to coupling-of-modes (COM) theory. Generally, the transduction center Tc may be defined as the position at which the input electric voltage and the generated acoustic wave are at maximum; and the reflection center Rc may be defined as the position at which the reflected acoustic wave is at its maximum. The phase difference between the transduction center Tc and the reflection center Rc is related to the spatial separation between the transduction center Tc and the reflection center Rc. In a bidirectional transducer (e.g., the input transducer 104), the transduction center Tc and reflection center Rc of each electrode 114 spatially coincide, as illustrated in FIG. 2, with no phase difference. For simplicity, only three electrodes 114 of the input transducer 104 are shown in FIG. 2. The input transducer 104 in this example has a symmetric electrode configuration, meaning that the electrodes 114 all have substantially equal width and are spaced apart from each other by substantially the same distance. The operating wavelength $\lambda$ is defined by the distance from the transduction center Tc of one positive electrode 114 to the transduction center Tc of the next positive electrode 114 (or similarly from the transduction center Tc of one negative electrode 114 to the transduction center Tc of the next negative electrode 114).

When the electrodes 114 have a symmetric configuration and the substrate 102 is also symmetric, the transduction center Tc and reflection center Rc of each electrode are at substantially the same location in space (i.e., the distance between Tc and Rc of a single electrode is zero, and the phase difference is zero). The distance between the transduction center Tc and reflection center Rc of one electrode, and the transduction center Tc and reflection center Rc of an adjacent electrode, is $\lambda/2$. In this transducer configuration, the SAW generated by the transducer 104 propagates bidirectionally, as indicated by the double-headed arrow.

Figure 3:
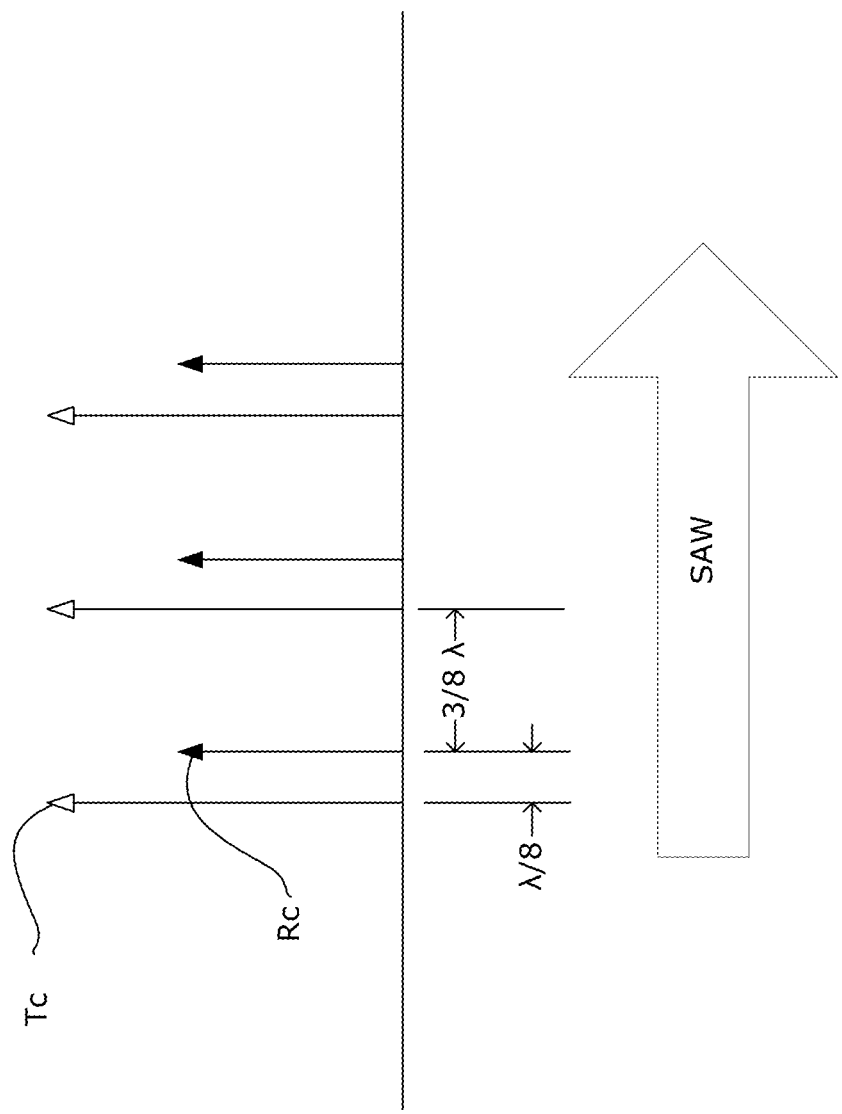
FIG. 3 illustrates the transduction center and reflection center of a unidirectional transducer.

With appropriate design of the SAW device, for example as in the examples disclosed herein, the transduction center Tc and reflection center Rc can be spatially separated (and thus have a non-zero phase difference), and directionality of the generated SAW can be controlled. In particular, as shown in FIG. 3, when the reflection center Rc is spatially offset from the transduction center Tc by a distance of $\lambda/8$ (or a phase difference of 45° or $\pi/8$ between the reflection center Rc and the transduction center Rc), the generated SAW propagates unidirectionally, as indicated by the arrow.

Figure 4A:
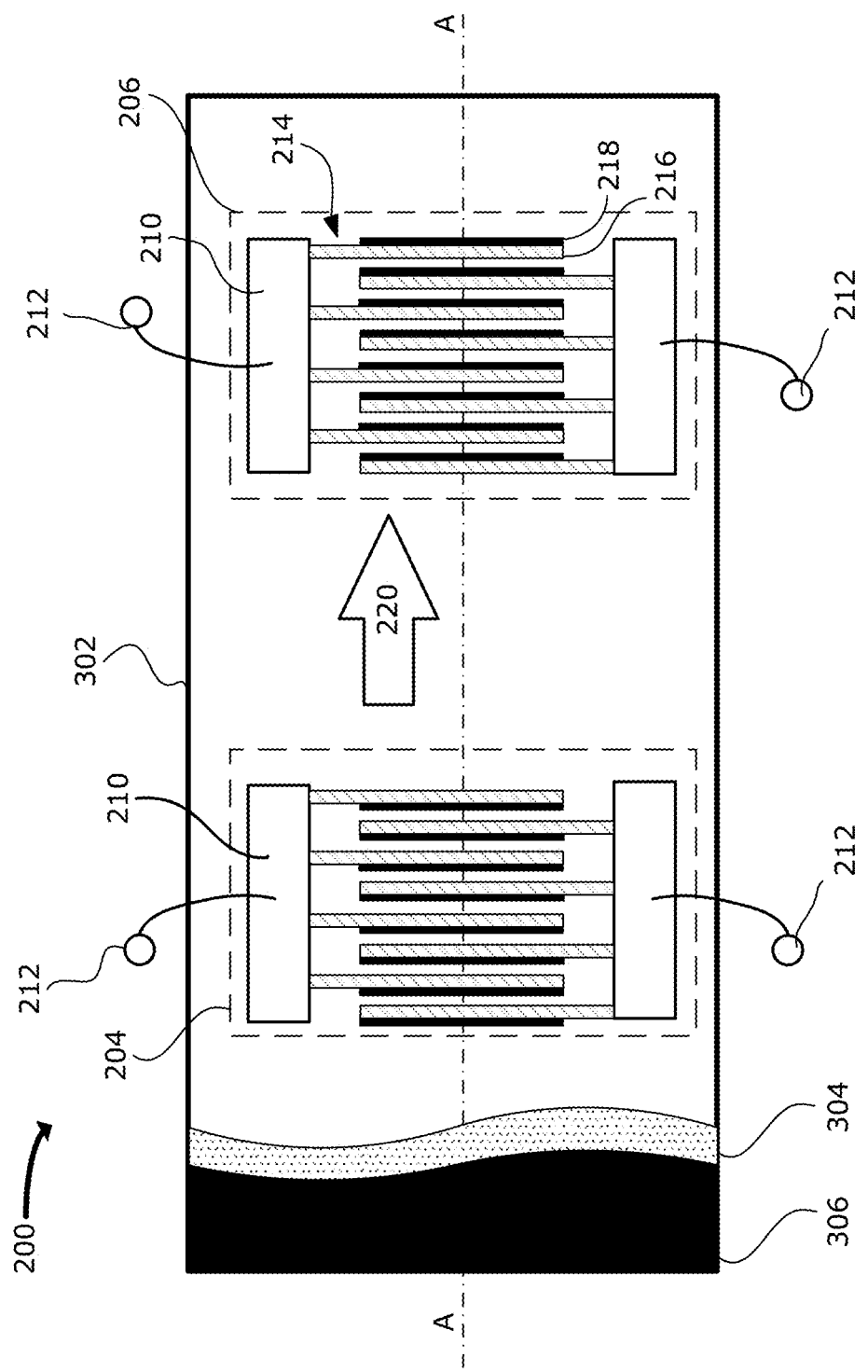
FIGS. 4A and 4B are a top view and a cross-sectional view, respectively, of an example disclosed SAW device.

An example disclosed SAW device 200 is illustrated in FIGS. 4A (top view) and 4B (cross-sectional view along dashed line A-A of FIG. 4), in which unidirectional propagation of a generated SAW is achieved, using a symmetric substrate and an electrode configuration having electric symmetry and mechanical asymmetry. Generally, in the present disclosure, symmetry in the electrode configuration refers to each electrode having geometry and material properties that are symmetrical to the center of the electrode width.

Figure 4B:
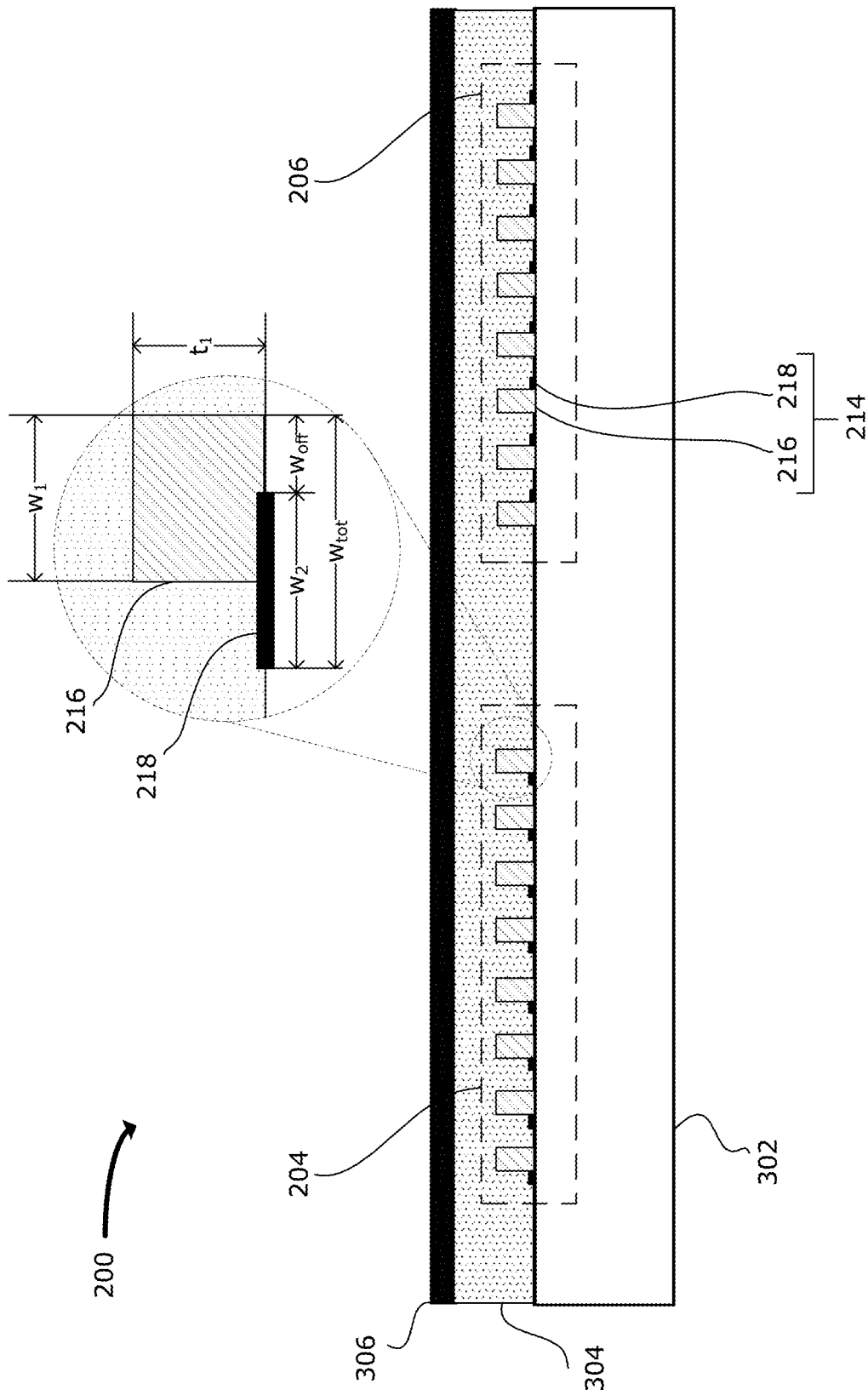

The SAW device 200 in the example of FIGS. 4A and 4B is a transversal filter. Similarly to the SAW device 100 of FIG. 1, the SAW device 200 of FIGS. 4A and 4B has an input transducer 204 and an output transducer 206 coupled to a substrate, which in this example is a high acoustic velocity layer 302 (e.g., diamond layer). The SAW device 200 also includes a piezoelectric layer 304 (e.g., scandium aluminum nitride (ScAlN)) and a conductive layer 306 (e.g., a metal layer, a borophene layer, a graphene layer, a composite metal-graphene layer, or a composite multi-metal layer such as an aluminum-copper-aluminum composite), both of which have been partially cut away to show the transducers 204, 206. In this example, the high acoustic velocity layer 302 is coupled to a first surface of the piezoelectric layer 304 and the conductive layer 306 is coupled to a second surface of the piezoelectric layer 304, opposing the first surface, with the transducers 204, 206 positioned between the piezoelectric layer 304 and the high acoustic velocity layer 306. Other configurations may be possible. For example, as discussed further below, the SAW device 200 may omit the high acoustic velocity layer 302 and/or the conductive layer 306.

Each of the transducers 204, 206 includes terminals 212 (e.g., a positive terminal and a grounded terminal). In the case of the input transducer 204, the terminals 212 are input terminals (e.g., positive and grounded input terminals). Similarly, for the output transducer 206, the terminals 212 are output terminals (e.g., positive and grounded output terminals). Each of the terminals 212 is coupled to respective electrodes 214 (e.g., positive electrodes and negative electrodes) via respective bonding pads 210. In each transducer 204, 206, the electrodes 214 are aligned with the longitudinal axes substantially parallel to each other and interlaced, in an alternating arrangement, such that each transducer 204, 206 is an IDT. Eight electrodes 214 are shown for each transducer 204, 206, however there may be greater or fewer numbers of electrodes 214 in each transducer 204, 206. Each electrode 214 has a multi-layer configuration, including a conductive first layer 216 and a conductive second layer 218.

Figure 5:
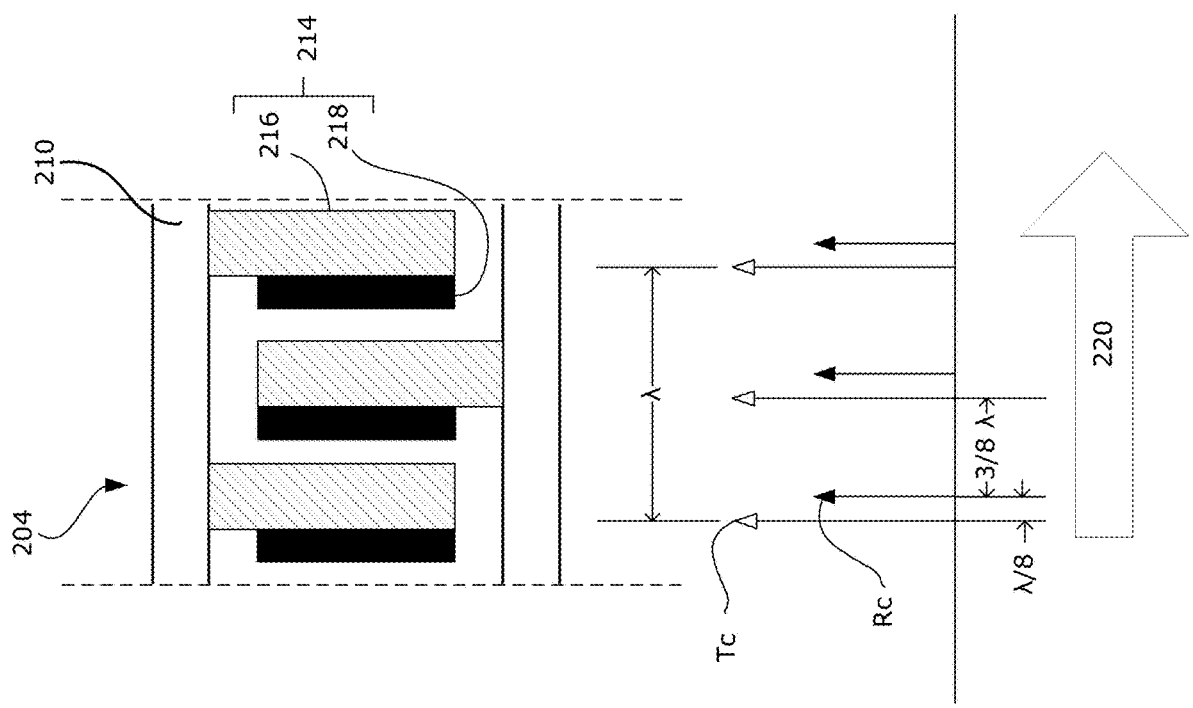
FIG. 5 illustrates the transduction center and reflection center of a transducer in the SAW device of FIGS. 4A and 4B.

The input transducer 204 has a configuration such that the SAW generated by the input transducer 204 propagates unidirectionally, in a wave propagation direction 220 that is generally perpendicular to the longitudinal axes of the electrodes 214. As shown in FIG. 5, which shows only three electrodes 214 of the input transducer 204 for the purpose of illustration, the transduction center Tc and the reflection center Rc of each electrode 214 are offset from each other by a distance of λ/8 (or a phase difference of 45° or λ/8 between the reflection center Rc and the transduction center Rc). Specifically, the reflection center Rc is offset from the transduction center Tc by a distance of distance of λ/8 in the wave propagation direction 220, thus resulting in unidirectional propagation of a SAW generated by the transducer 204.

Reference is again made to FIGS. 4A and 4B. In the example disclosed SAW device 200, the first layer 216 and the second layer 218 of each electrode 214 are in electrical contact with each other. In this example, the first and second layers 216, 218 are both formed on the surface of the high acoustic velocity layer 302.

The first layer 216 has a first thickness $t_1$ and a first width $w_1$, and the second layer 218 has a second thickness (not indicated) and a second width $w_2$. At least a portion of the second layer 218 extends beyond the width $w_1$ of the first layer 216, such that the total width $w_{tot}$ of the electrode 214 is greater than the width $w_1$ of the first layer. In the example shown, the first layer 216 at least partially overlaps with the second layer 218, with an offset distance $w_{off}$ (e.g., equal to λ/8) between the first layer 216 and the second layer 218. In other examples, there may be no overlap between the first layer 216 and the second layer 218 (e.g., the first and second layers 216, 218 may be abutting each other and in electrical contact with each other, but not overlapping) or the offset distance $w_{off}$ may be zero (i.e., the entire width $w_1$ of the first layer 216 overlaps with the second layer 218). In the case where the offset distance $w_{off}$ is zero, the width $w_2$ of the second layer 218 is greater than the width $w_1$ of the first layer 216, such that the total width $w_{tot}$ of the electrode 214 is greater than the width $w_1$ of the first layer.

The second layer 218 has a second thickness that is much thinner than the first thickness $t_1$. In particular, the second thickness may be negligible or substantially zero, such that the second layer 218 has no or negligible mechanical weight (that is, has no mechanical mass-loading effect). It should be understood that although the second layer 218 may be described as having substantially no mechanical weight or having substantially a zero thickness, the second layer 218 is not omitted. Rather, the second layer 218 is sufficient to provide electrical conduction over its entire second width $w_2$. Thus, the electrode 214 provides electrical conduction over a total width $w_{tot}$ that is greater than the first width $w_1$ of the first layer 216, however because the mass of the electrode 214 is substantially provided by only the first layer 216, the electrode 214 has significant mechanical weight only over the first width $w_1$. Accordingly, the reflection center Rc (which is dependent on the mass distribution of the electrode 214) is spatially offset from the transduction center Tc (which is mainly dependent on the charge density of the electrode 214).

In order to achieve a second layer 218 that provides electrical conduction but substantially no mechanical weight, the second layer 218 may be made of graphene, for example multi-layer graphene having 3-10 atomic layers. It may be preferable to use a multi-layer graphene rather than a monolayer of graphene, in order to achieve a better stress response. Examples of electrodes using multi-layer graphene are described in U.S. patent application Ser. No. 15/713,117, entitled "SURFACE ACOUSTIC WAVE DEVICE", filed Sep. 22, 2017, the entirety of which is hereby incorporated by reference. Any other electrically conductive material (e.g., thin metal layer or thin metal-graphene composite layer) may be used for the second layer 218, provided the requirements for sufficient electrical conduction and negligible mechanical weight are satisfied. For example, any substantially two-dimensional conductive material, such as graphene or borophene, may be a suitable material for the second layer 218.

As previously explained, the operating wavelength A of the SAW device 100 is determined by the distance between the transduction centers Tc of two adjacent electrodes 214 of the same polarity. Generally, a SAW device of the highest possible operating frequency can be achieved by forming the electrodes 214 to be as narrow as possible and keeping the spacing between adjacent electrodes 214 to be as small as possible. For example, it may be desirable for the widths $w_1$, $w_2$ of the first and second layers 216, 218 to be as narrow as possible, the spacing between adjacent first layers 216 to be as narrow as possible, and the spacing between adjacent second layers 218 to be as narrow as possible. The minimum widths $w_1$, $w_2$ and the minimum spacing are dependent on the smallest practical feature size of the lithography process used during fabrication. In the example disclosed electrode configuration, it is possible for the widths $w_1$, $w_2$ of the layers 216, 218, the spacing between two adjacent first layers 216, and the spacing between two adjacent second layers 218 to all be the smallest practical feature size, equal to λ/4 in terms of the operating wavelength. For a typical lithography process used in fabrication of a SAW device, due to tradeoffs between the feature size of the lithography process and material characteristics, the smallest line that is achievable in practice is about 0.2 μm in width. Accordingly, an operating wavelength A of 0.8 μm can be achieved. This compares favorably with conventional FEUDT devices, in which, due to the electrode configuration used, λ/12 corresponds to the smallest practical feature size. Accordingly, the example disclosed device 200 may be able to achieve an operating frequency that is three times higher than that of a conventional FEUDT device. Generally, the highest operating frequency that can be achieved is dependent on the acoustic wave propagation velocity of the substrate used for the SAW device. Where the disclosed SAW device 200 uses a substrate having a very high acoustic wave propagation velocity (e.g., AlN/diamond structure), an operating frequency of about 14 GHz may be achieved.

The configuration of the first and second layers 216, 218 may be adjusted (e.g., with the aid of simulations) to achieve a desired amount of offset (e.g., an offset of λ/8) between the transduction center Tc and the reflection center Rc. In particular, the parameters of first thickness $t_1$, first width $w_1$, and total width $w_{tot}$ (or second width $w_2$ and offset distance $w_{off}$ taken individually) may be adjusted (e.g., with the aid of simulations) to achieve the desired offset between transduction center Tc and reflection center Rc.

Figure 6A:
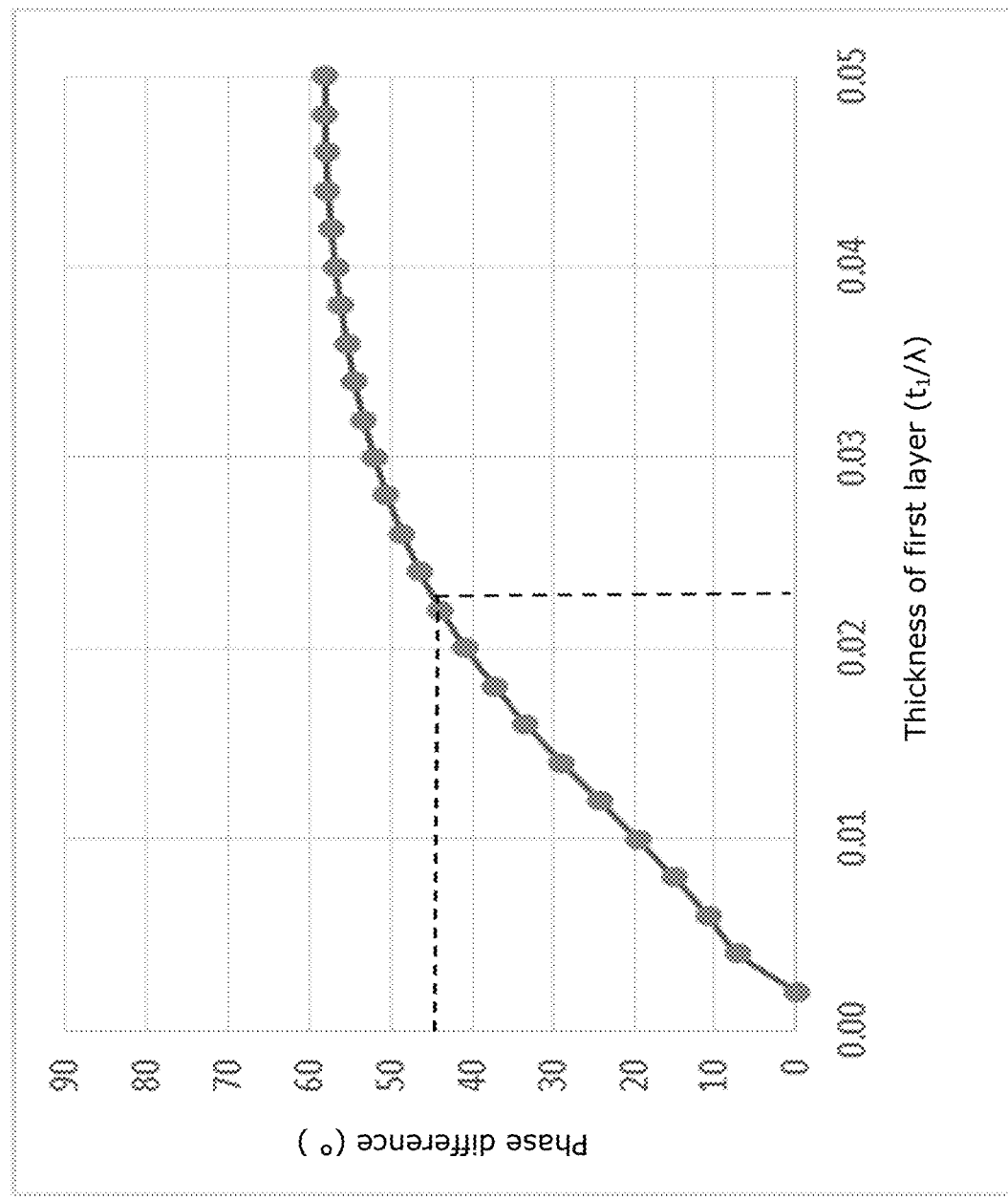
FIG. 6A is a plot of phase offset between the transduction center and reflection center vs. thickness of metal layer in the electrodes of the SAW device of FIGS. 4A and 4B.
Figure 6B:
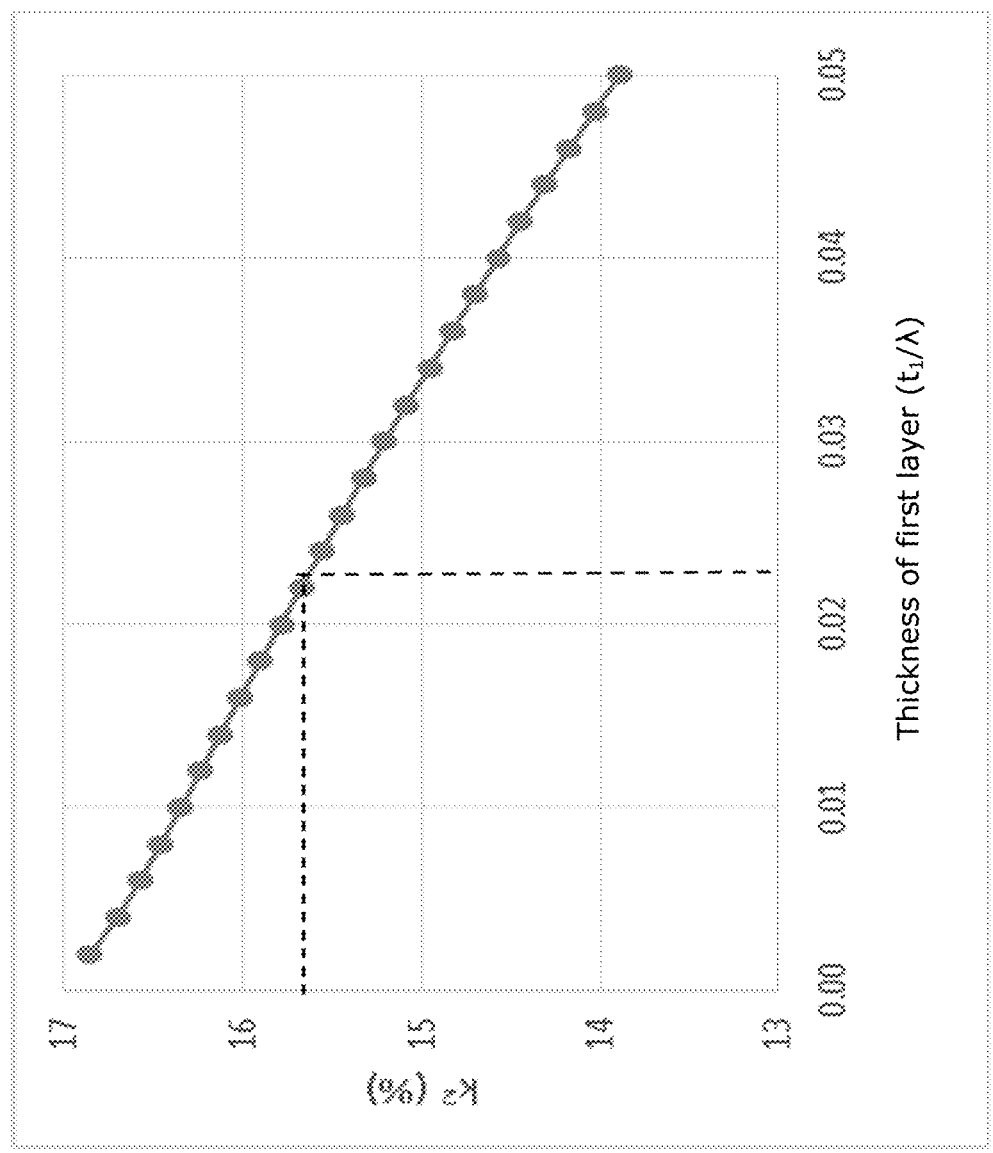
FIG. 6B is a plot of electromechanical coupling coefficient vs. thickness of metal layer in the electrodes of the SAW device of FIGS. 4A and 4B.

FIG. 6A is a simulation plot illustrating how the offset (measured as the phase difference in FIG. 6A) between the transduction center Tc and reflection center Rc varies with thickness $t_1$ of the first layer 216, when the first layer 216 is an aluminum (Al) metal layer having a first width $w_1$ of λ/4, the second layer 218 is a 3 atomic layer graphene layer having a second width $w_2$ of λ/4, and the offset distance $w_{off}$ between the first and second layers 216, 218 is λ/8. In this example simulation, the SAW device 200 (similar to that shown in FIG. 4A) includes the conductive layer 306, which in this case is a 3 atomic layer graphene layer. The piezoelectric layer 304 is a ScAlN layer with a thickness of 0.2 λ, and the high acoustic velocity layer 302 is a diamond layer with a thickness of 3 λ. As can be seen from FIG. 6A, the desired phase difference of 45° (corresponding to a spatial offset of λ/8) between the transduction center Tc and reflection center Rc is achieved when the first thickness $t_1$ of the first layer 216 is about 0.023 λ (as indicated by dashed lines). As shown in FIG. 6B, at a first thickness $t_1$ of about 0.023 λ, the electromechanical coupling coefficient $k^2$ is about 15.7% (as indicated by dashed lines), which is considered to be sufficiently high.

Figure 6C:
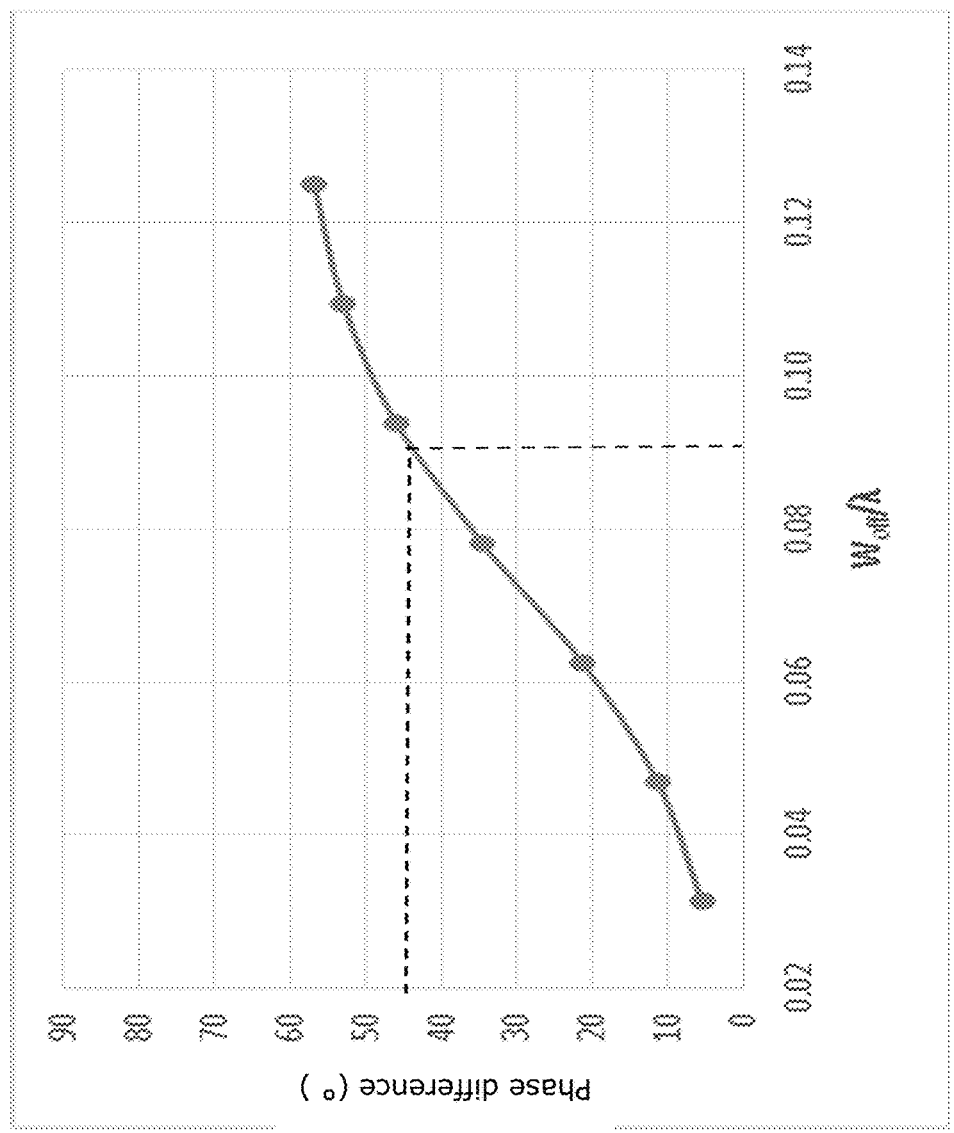
FIG. 6C is a plot of phase offset between the transduction center and reflection center vs. offset between first and second layers in the electrodes of the SAW device of FIGS. 4A and 4B.
Figure 6D:
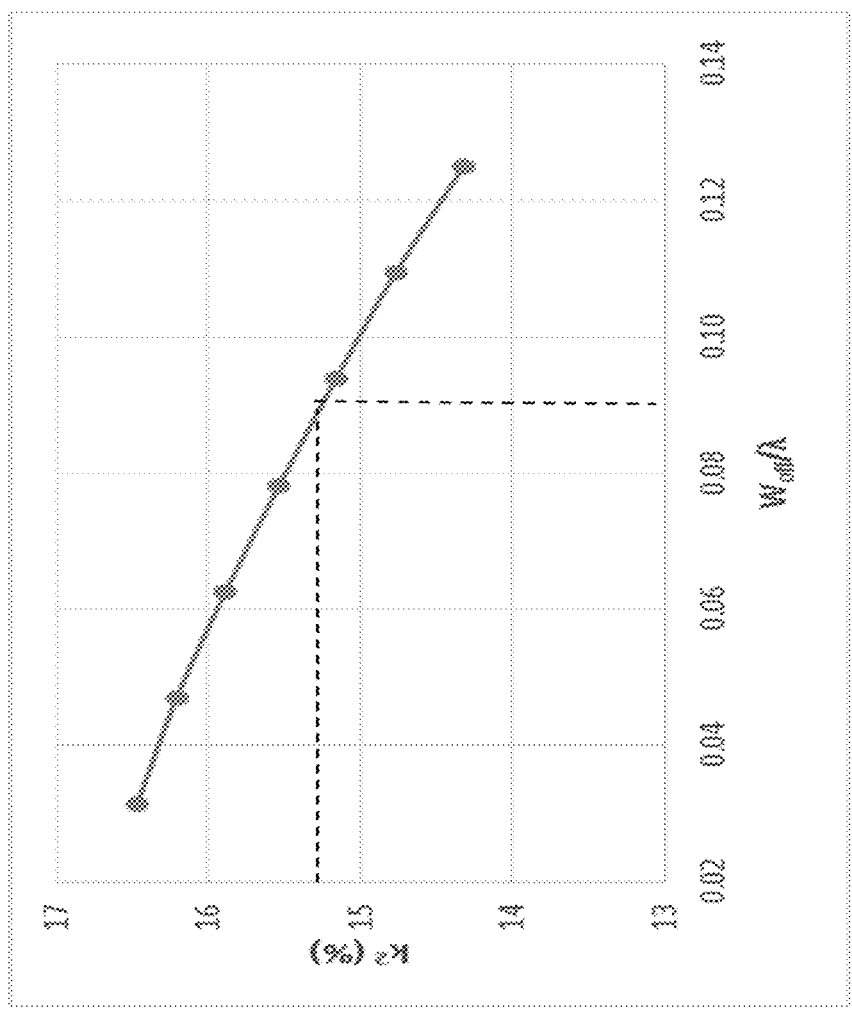
FIG. 6D is a plot of electromechanical coupling coefficient vs. offset between first and second layers in the electrodes of the SAW device of FIGS. 4A and 4B.

Similar simulations may be carried out to determine different suitable configuration parameters for the first and second layers 216, 218 (e.g., when the thickness $t_1$ of the first layer 216 is fixed and the offset distance $w_{off}$ is varied) The simulations may be carried out to determine suitable configuration parameters when different materials are used for the first and second layers 216, 218. Simulations may also be carried out to determine suitable configuration parameters when different materials and/or thicknesses are used for the piezoelectric layer 304, high acoustic velocity layer 302 (which may be omitted in some examples) and optional conductive layer 306. For example, FIG. 6C is a plot showing simulation results illustrating how the transduction and reflection phase difference varies with offset distance $w_{off}$ between the first and second layers 216, 218. In this simulation, the device configuration is similar to that described above for FIG. 6A, however the first thickness $t_1$ is fixed at 0.04 λ and the offset distance $w_{off}$ is varied. FIG. 6D is a plot showing simulation results illustrating how the electromechanical coupling coefficient $k^2$ varies with the offset distance $w_{off}$. As can be seen from FIG. 6C, the desired phase difference of 45° is achieved when the offset distance $w_{off}$ is about 0.09 λ (as indicated by dashed lines). At this offset distance $w_{off}$=0.09 λ, FIG. 6D shows that the electromechanical coupling coefficient $k^2$ is above 15% (as indicated by dashed lines). It should be noted that these simulation results are for a particular device configuration, and the results may be different for other device configurations. Further, for any given device configuration different combinations of parameters may be found (e.g., using suitable simulations) to achieve a desired phase difference of 45° and desired high electromechanical coupling coefficient.

Reference is again made to FIGS. 4A and 4B. In some examples, only one of the first or second layer 216, 218 of each electrode 214 is in direct contact with the bonding pad 210. For example, the first layer 216 may longitudinally extend to the bonding pad 210. The second layer 218 does not extend to the bonding pad 210, but longitudinally extends at least the full aperture length of the transducer 204, 206. In other examples, both the first and second layers 216, 218 extend to the bonding pad 210.

In the example of FIGS. 4A and 4B, the transducers 204, 206 are coupled between a high acoustic velocity layer 302 and a piezoelectric layer 304. As discussed above, the input transducer 204 is configured such that the reflection center Rc is offset from the transduction center Tc by a distance of λ/8 in the wave propagation direction 220, such that the generated SAW propagates unidirectionally in the wave propagation direction 220. Additionally, the output transducer 206 is configured such that the reflection center Rc is offset from the transduction center Tc by a distance of λ/8 in a direction opposite to the wave propagation direction 220, so as to have a directionality opposite to the wave propagation direction 220. The input and output transducers 204, 206 may be mirror images of each other. In some examples, the SAW device 200 may be a single-transducer device, with only a single unidirectional transducer 204. In some examples, the SAW device 200 may have a unidirectional transducer 204 as disclosed herein, together with a conventional IDT.

Figure 7:
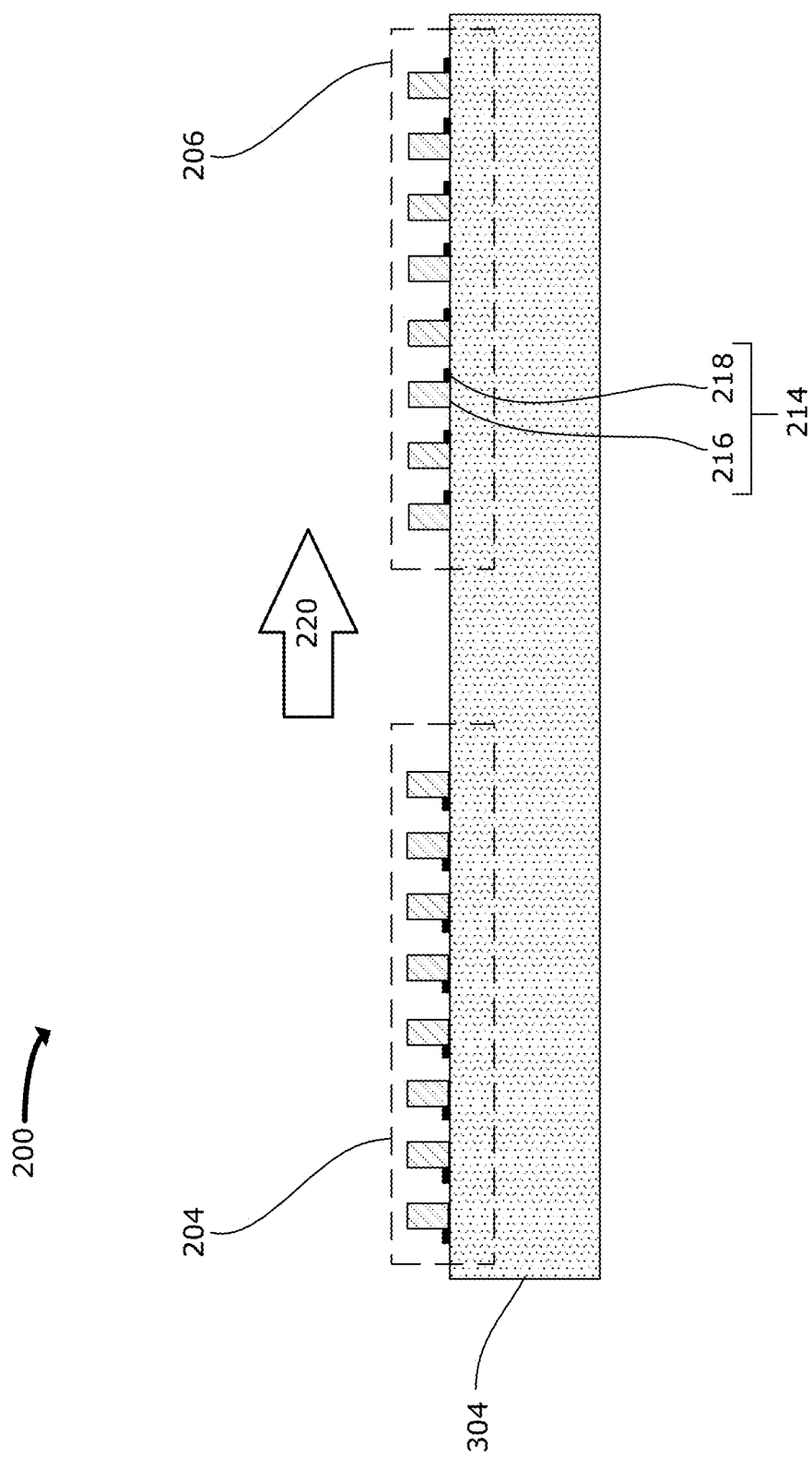
FIG. 7 is a cross-sectional view of another example disclosed SAW device.

FIG. 7 illustrates another example of the disclosed SAW device 200. The dimensions of certain features have been exaggerated for illustration purposes. In this example, the SAW device 100 is implemented on a single crystal substrate, rather than a multi-layer substrate. Here, the transducers 204, 206 are coupled to the surface of the piezoelectric layer 304 (e.g., 128° lithium niobate (LiNbO$_3$) crystal) without the high acoustic velocity layer 302. In the example shown, the first and second layers 216, 218 of the electrodes 214 are configured similarly to that shown in FIGS. 4A and 4B, such that the SAWs generated by the input transducer 204 propagate unidirectionally towards the output transducer 206, and the directionality of the output transducer 206 is opposite to the wave propagation direction 220. The omission of the high acoustic velocity layer 302 may allow for a simpler fabrication process. In some examples, the high acoustic velocity layer 302 may be present and coupled below the piezoelectric layer 304 (i.e. on an opposite surface to where the transducers 204, 206 are coupled), and further a conductive layer 306 may or may not be present between the piezoelectric layer 304 and the high acoustic velocity layer 302.

Figure 8:
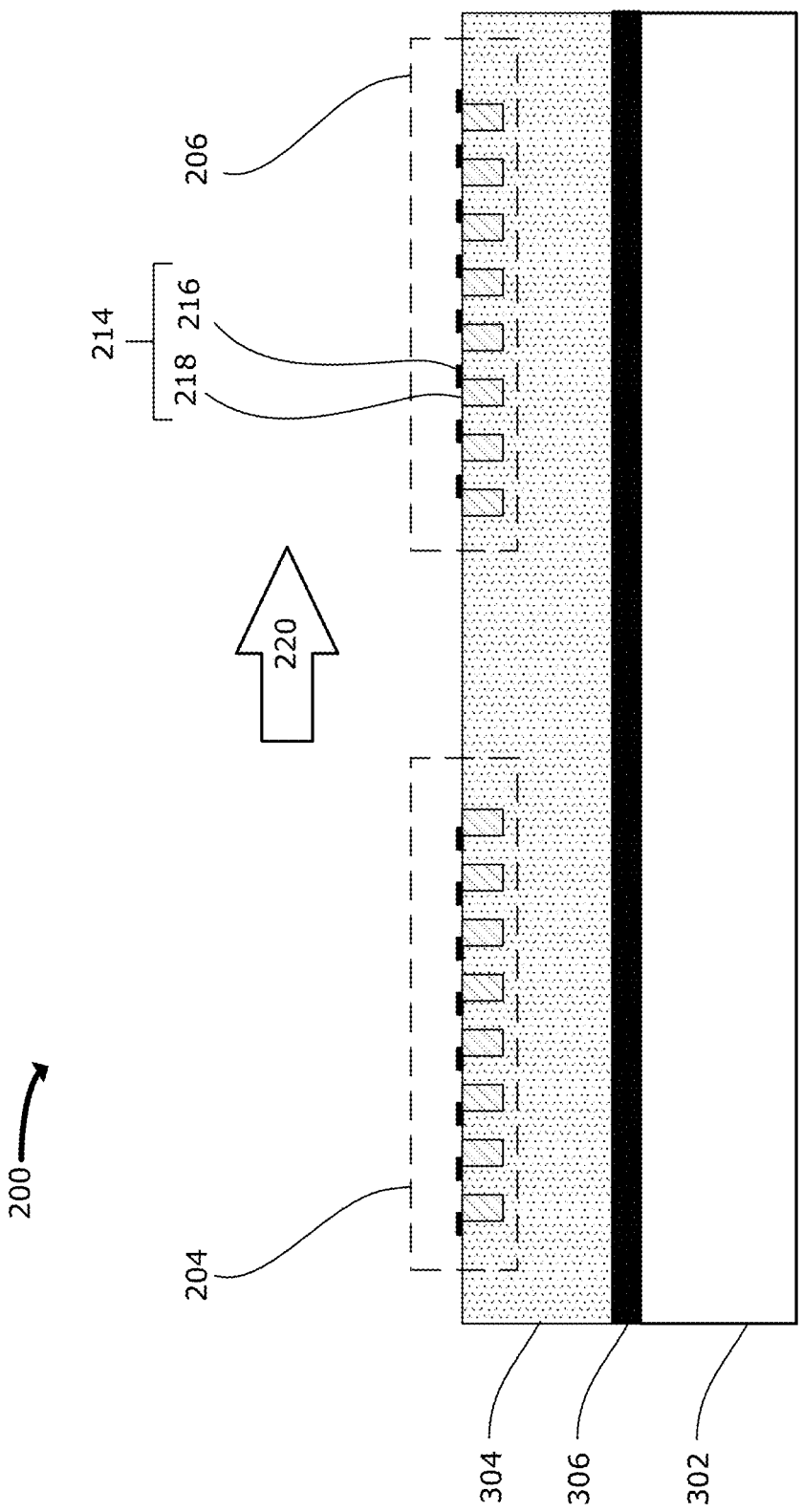
FIG. 8 is a cross-sectional view of another example disclosed SAW device.

FIG. 8 illustrates another example of the disclosed SAW device 200. The dimensions of certain features have been exaggerated for illustration purposes. In this example, the high acoustic velocity layer 302 (e.g., a diamond layer) is coupled to a first surface of the piezoelectric layer 304 (e.g., an aluminum nitride (AlN) film), and the transducers 204, 206 are coupled to a second surface of the piezoelectric layer 304, opposite to the first surface. Optionally, as shown in FIG. 8, the SAW device 200 may include the conductive layer 306 coupled between the high acoustic velocity layer 304 and the piezoelectric layer 302, in which case the high acoustic velocity layer 302 is coupled to the piezoelectric layer 204 via the conductive layer 306.

In the example of FIG. 8, the first layer 216 of the electrode 214 is embedded in the piezoelectric layer 304 (that is, positioned on a plane below the second surface of the piezoelectric layer 304) and the second layer 218 is positioned on the surface of the piezoelectric layer 304. The upper surface of the first layer 216 may be substantially flush with the surface of the piezoelectric layer 304, so as to maintain electrical contact with the second layer 218. The first and second layers 216, 218 of the electrodes 214 may be configured similarly to the electrodes of FIGS. 4A and 4B, but vertically flipped. The transduction center Tc and reflection center Rc are still offset from each other by λ/8, such that the input transducer 204 generates and propagates SAWs unidirectionally towards the output transducer 206, and the directionality of the output transducer 206 opposite to the wave propagation direction 220.

Generally, embedding at least the first layer 216 of the electrodes 214 in a substrate (e.g., the piezoelectric layer 304) or positioning the electrodes 214 between two layers (e.g., between the high acoustic velocity layer 302 and the piezoelectric layer 304) may help to improve the stress response of the SAW device 200.

Although certain example configurations of the SAW device 200 have been disclosed, other configurations that combine features of the different examples are also within the scope of the present disclosure. For example, the disclosed SAW device 200 may have only one transducer 204 (e.g., in the case of acousto-optical devices), or may have input and output transducers 204, 206. The disclosed SAW device 200 may have the transducer(s) 204, 206 positioned between the high acoustic velocity layer 302 and the piezoelectric layer 204, and there may be an optional conductive layer 306 on top of the piezoelectric layer 204. The disclosed SAW device may have the transducer(s) 204, 206 positioned on top of the piezoelectric layer 304, there may be an optional high acoustic velocity layer 302 supporting the piezoelectric layer 304, and there may be an optional conductive layer 306 between the high acoustic velocity layer 302 and the piezoelectric layer 304. The electrodes 214 of the transducer(s) 204, 206 may be formed such that the first layer 216 is embedded in the substrate (e.g., the high acoustic velocity layer 302 or the piezoelectric layer 304) and the second layer 218 is formed on the surface of the substrate, whether the substrate is a single crystal substrate or a multi-layer substrate. The electrodes 214 of the transducer(s) 204, 206 may be formed such that both the first and second layers 216, 218 are formed on the surface of the substrate. Different configurations may be more suitable for SAW propagation in different wave modes (e.g., Rayleigh mode or Sezawa mode), and may provide different advantages in terms of the stress response and the electromechanical coupling coefficient.

The disclosed SAW device may be adapted to include an NSPUDT as an input transducer or an output transducer. In a typical NSPUDT device, a symmetric electrode configuration is used for the input transducer, and directionality of the generated SAW is caused by asymmetry of the NSPUDT substrate. However, because the output transducer is on the same asymmetrical substrate, there is a challenge in reversing the directionality at the output transducer. The disclosed SAW device can be adapted to reverse the directionality of the output transducer. For example, the input transducer can be a conventional IDT coupled to the asymmetrical NSPUDT substrate, and the output transducer can have electrodes with the first and second layers designed (e.g., with the aid of simulations) to achieve a phase difference of 45° between the transduction center and reflection center, so as to reverse the directionality imparted by the substrate.

The example SAW devices 200 disclosed herein may be fabricated using any suitable fabrication techniques. Conventional lithography processes may be used. In some examples, the SAW device 200 may be fabricated by forming the first layer 216 on a substrate (e.g., in etched portions of the substrate, if the first layer 216 is to be embedded in the substrate), followed by forming the second layer 218 to be in electrical contact with the first layer 216. The second layer 218 may be formed to at least partially overlap the first layer 216. In some examples, the SAW device 200 may be fabricated by forming the second layer 218 on the surface of the substrate (e.g., without requiring etching of the substrate), followed by forming the first layer 216 to be in electrical contact with the second layer 218. The first layer 216 may be formed to at least partially overlap the second layer 218. The substrate may be the high acoustic velocity layer 302 (e.g., as in the example shown in FIGS. 4 and 5) or may be the piezoelectric layer 304 (e.g., as in the examples shown in FIGS. 7 and 8). Generally, it may be preferable to form the second layer 218 first, because the thickness of the first layer 216 may make it more difficult to form the second layer 218 on top of the first layer. In some cases, such as where the electrode 214 is embedded in a substrate (e.g., as shown in FIG. 8), it may be preferable to form the first layer 216 first, followed by the second layer 218 on top. Generally, suitable masks are used for forming the first and second layers 216, 218 of the electrode 214, so that the first and second layers 216, 218 are in electrical contact and to achieve the desired electrode configuration having the desired offset between the transduction center Tc and the reflection center Rc. Where multiple photomasks are used, suitable techniques (e.g., providing alignment markers on the masks) may be used to ensure that the masks are appropriate aligned, so as to ensure the desired offset distance $w_{off}$ is achieved.

Figure 9:
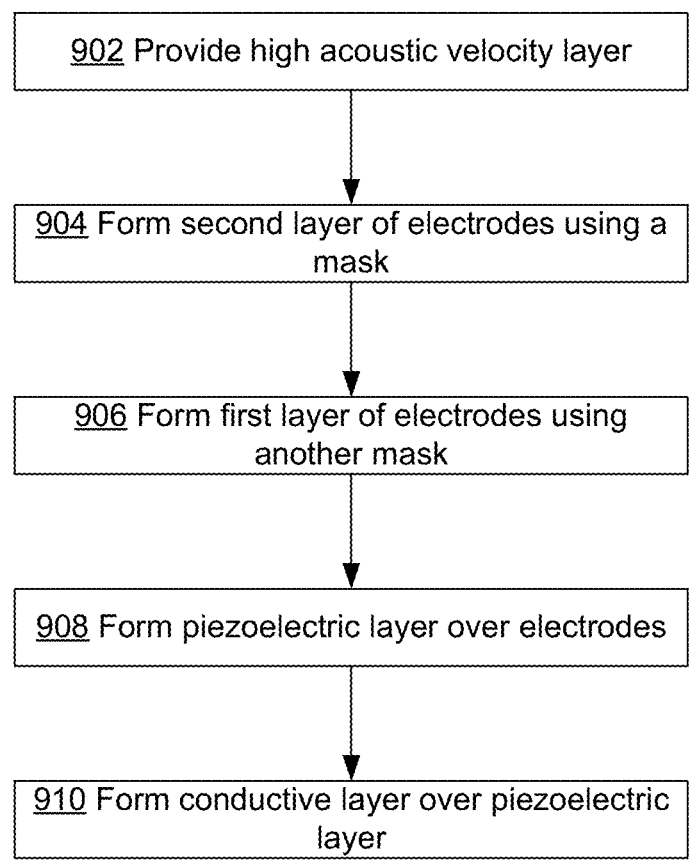
FIG. 9 is a flowchart illustrating an example method for fabricating the SAW device of FIGS. 4A and 4B.

FIG. 9 is a flowchart illustrating an example method 900 for fabricating the example SAW device 200 of FIGS. 4A and 4B.

At 902, the high acoustic velocity layer 302 is provided. For example, a diamond layer may be provided with suitable thickness (typically several times thicker than λ) using chemical vapor deposition (or other suitable technique) on a support substrate (e.g., a silicon substrate). The diamond layer may also be polished and cleaned.

At 904, the second layer 218 of the electrodes 214 is formed on the high acoustic velocity layer 302, using a mask. For example, if the second layer 218 is multi-layer graphene, forming the second layer 218 may involve epitaxial graphene growth to the desired number of atomic layers. If the second layer 218 is borophene, forming the second layer 218 may involve growing the borophene layer using a suitable growth process.

At 906, the first layer 216 of the electrodes 214 is formed using another mask. For example, if the first layer 216 is a metal (e.g., Al), the first layer 216 may be formed by depositing a layer of metal using suitable metal deposition techniques, followed by removal of the photoresist.

At 908, the piezoelectric layer 304 is formed over the electrodes 214. For example, this may be by sputtering or chemical vapor deposition of ScAlN to the desired thickness.

At 910, the conductive layer 306 is formed over the piezoelectric layer 304. If the conductive layer 306 is made of graphene, the conductive layer 306 may be formed by growth of graphene layers to the desired number of layers. If the conductive layer 306 is made of borophene, the conductive layer 306 may be formed by growth of borophene using a suitable growth process. If the conductive layer 306 is made of metal (e.g., Cu), the conductive layer 306 may be formed by deposition of the metal using any suitable deposition techniques. In some examples, the conductive layer 306 may be omitted and hence 910 may be omitted from the example method 900.

Figure 10:
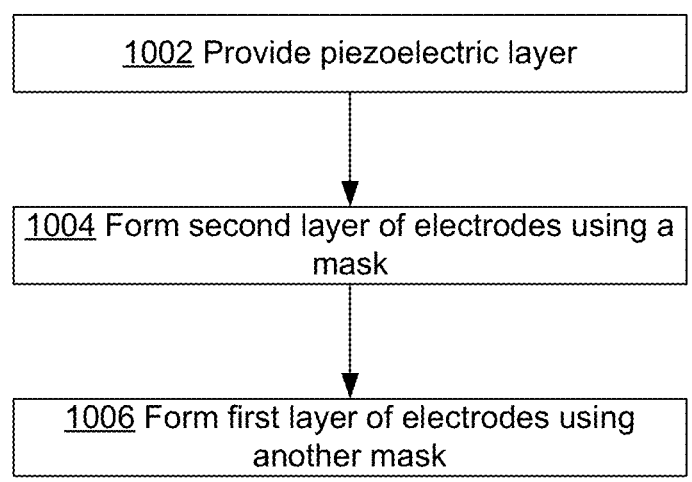
FIG. 10 is a flowchart illustrating an example method for fabricating the SAW device of FIG. 7.

FIG. 10 is a flowchart illustrating an example method 1000 for fabricating the example SAW device 200 of FIG. 7. Certain steps in the example method 1000 may be performed similarly to similar steps in the example method 900

At 1002, the piezoelectric layer 304 is provided. For example, in the case of a single crystal substrate as shown in FIG. 7, a piezoelectric crystal (e.g., LiNbO$_3$ crystal) having a desired thickness (e.g., 0.5 mm thick) is provided.

At 1004, the second layer 218 of the electrodes 214 is formed on the piezoelectric layer 304, using a mask. For example, if the second layer 218 is multi-layer graphene, forming the second layer 218 may involve epitaxial graphene growth to the desired number of atomic layers. If the second layer 218 is borophene, forming the second layer 218 may involve growing the borophene layer using a suitable growth process.

At 1006, the first layer 216 of the electrodes 214 is formed using another mask. For example, if the first layer 216 is a metal (e.g., Al), the first layer 216 may be formed by depositing a layer of metal using suitable metal deposition techniques, followed by removal of the photoresist.

Figure 11:
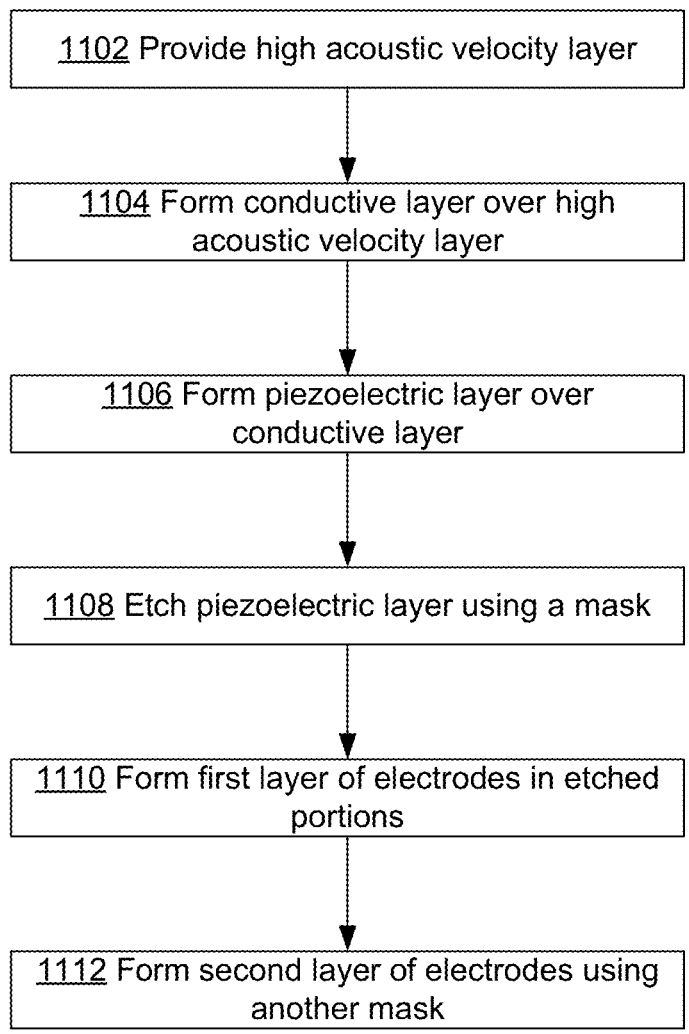
FIG. 11 is a flowchart illustrating an example method for fabricating the SAW device of FIG. 8.

FIG. 11 is a flowchart illustrating an example method 1100 for fabricating the example SAW device 200 of FIG. 8.

Certain steps in the example method 1100 may be performed similarly to similar steps in the example methods 900, 1000.

At 1102, the high acoustic velocity layer 302 is provided. For example, a diamond layer may be provided with suitable thickness (typically several times thicker than A) using chemical vapor deposition (or other suitable technique) on a support substrate (e.g., a silicon substrate). The diamond layer may also be polished and cleaned.

At 1104, the conductive layer 306 is formed over the high acoustic velocity layer 302. If the conductive layer 306 is made of graphene, the conductive layer 306 may be formed by growth of graphene layers to the desired number of layers. If the conductive layer 306 is made of borophene, the conductive layer 306 may be formed by growth of borophene using a suitable growth process. If the conductive layer 306 is made of metal (e.g., Cu), the conductive layer 306 may be formed by deposition of the metal using any suitable deposition techniques. In some examples, the conductive layer 306 may be omitted and hence 1104 may be omitted from the example method 1100.

At 1106, the piezoelectric layer 304 is formed over the conductive layer 306 (or over the high acoustic velocity layer 302, if the conductive layer 306 is omitted). For example, this may be by sputtering or chemical vapor deposition of ScAlN, AlN, or other suitable piezoelectric thin film to the desired thickness.

At 1108, the piezoelectric layer 304 is etched using a mask. The piezoelectric layer 304 may be etched to a desired thickness, depending on the desired thickness of the first layer 216 of the electrodes 214.

At 1110, the first layer 216 of the electrodes 214 is formed in the etched portions of the piezoelectric layer 304. For example, if the first layer 216 is a metal (e.g., Al), the first layer 216 may be formed by depositing a layer of metal using suitable metal deposition techniques, followed by removal of the photoresist. The first layer 216 may be formed to be substantially flush with the unetched surface of the piezoelectric layer 304.

At 1112, the second layer 218 of the electrodes 214 is formed using another mask. For example, if the second layer 218 is multi-layer graphene, forming the second layer 218 may involve epitaxial graphene growth to the desired number of atomic layers. If the second layer 218 is borophene, forming the second layer 218 may involve growing the borophene layer using a suitable growth process.

In various examples, the first layer of the electrodes may be formed with any conductive material that can provide suitable thickness, such as a metal layer. Suitable metals may include copper (Cu), aluminum (Al), platinum (Pt), Aluminum-copper alloys (Al/Cu/Al), molybdenum (Mo), tungsten (W), titanium (Ti), gold (Au), nickel (Ni) and titanium nitride (TiN), silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

In various examples, the second layer of the electrodes may be formed with any conductive material that can provide sufficient electrical conduction while the material is thin enough to have negligible mechanical weight. For example, the second layer may be a metal layer (e.g., any of the metals listed above) if a suitably thin and conductive metal layer can be achieved. For example, the second layer may be any substantially two-dimensional conductive material, such as a multi-layer graphene, for example 3-10 atomic layers of graphene, or borophene.

In some examples, the SAW device includes a conductive layer. The conductive layer may, in various examples, comprise any conductive material, such as a metal layer, a borophene layer, a graphene layer, or a metal layer coupled to a graphene layer (also referred to as a metal-graphene composite). A suitable metal layer conductive layer may include copper (Cu), aluminum (Al), platinum (Pt), and/or Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals. A suitable graphene layer may be a graphene multi-layer, for example 3-10 atomic layers of graphene. A metal-graphene composite layer may combine any suitable metal with any suitable multi-layer graphene. Some examples of the conductive layer are described in previously-referenced U.S. patent application Ser. No. 15/713,117.

In various examples, the piezoelectric layer may be a ScAlN layer. Other materials may also be used for the piezoelectric layer, such as aluminum nitride (AlN), zinc oxide (ZnO), lithium niobate (LiNbO$_3$), lithium tantalite (LiTaO$_3$), quartz and other piezoelectric materials.

In various examples, the high acoustic velocity layer may be a diamond layer. Other materials may also be used for the high acoustic velocity layer, such as silicon carbide (SiC), or other high acoustic velocity materials.

Different configurations of the SAW device have been disclosed herein. A particular configuration may be selected for use depending on the specific application. Although the disclosed SAW device has been described with reference to SAW filters, it should be understood that the disclosed SAW configurations may be adapted for use in other SAW devices.

In various examples disclosed herein, SAW devices having at least one unidirectional transducer are described. The disclosed example SAW devices may overcome drawbacks of conventional SAW devices with unidirectional transducers. For example, compared to a device using NSPUDT, the direction of SAW propagation in the disclosed example SAW devices can be reversed. Compared to a device using FEUDT, the disclosed example SAW devices may be able to achieve a higher maximum operating frequency, when using the same size fabrication node. Compared to a device using film thickness difference type SPUDT, the disclosed example SAW devices may be fabricated using a simpler fabrication process.

The disclosed SAW devices may be useful for implementation as SAW filters in mobile terminals, base station and other infrastructure equipment, for example. The disclosed SAW devices may also be embodied as a compact Mach-Zenhder acousto-optic modulator, in which use of the unidirectional transducer may be expected to reduce loss (compared to use of a conventional bidirectional interdigital transducer).

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure. For examples, although specific sizes and shapes of electrodes are disclosed herein, other sizes and shapes may be used. In another example, although a particular SAW device (e.g. SAW filter) may be described herein, the structures described may be adapted to other SAW device configurations.

The dimensions described herein are meant to be illustrative and not restrictive. The figures may exaggerate or minimize the height of these layers for illustrative purposes and/or for ease of reference.

Although the example embodiments may be described with reference to a particular orientation (e.g. upper and lower surfaces), this was simply used as a matter of convenience and ease of reference in describing the figures.

Although the present disclosure describes methods and processes with steps in a certain order, one or more steps of the methods and processes may be omitted or altered as appropriate. One or more steps may take place in an order other than that in which they are described, as appropriate.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A surface acoustic wave (SAW) device comprising:
   a piezoelectric layer;
   a transducer coupled to the piezoelectric layer, the transducer including a plurality of electrodes, the plurality of electrodes being aligned with respective longitudinal axes parallel to each other and perpendicular to a wave propagation direction;
   each electrode of the transducer including:
      a conductive first layer having a first thickness and a first width in the wave propagation direction, the first layer comprising a metal layer; and
      a conductive second layer having a second thickness that is thinner compared to the first thickness, the second layer comprising graphene or borophene having the second thickness of 3-10 atomic layers;
      the first layer and second layer being in electrical contact with each other to provide electrical conduction over a total width of the electrode in the wave propagation direction, the total width being greater than the first width of the first layer.

2. The SAW device of claim 1, wherein, in each electrode, the first layer at least partially overlaps with the second layer, and the first layer is spatially offset from the second layer in the wave propagation direction.

3. The SAW device of claim 2, wherein the offset between the first layer and the second layer is equal to one-eighth of an operating wavelength of the SAW device.

4. The SAW device of claim 1, further comprising:
   an acoustic velocity layer coupled to the piezoelectric layer at a first surface of the piezoelectric layer, the acoustic velocity layer having an acoustic velocity higher than that of the piezoelectric layer;
   wherein the transducer is positioned between the piezoelectric layer and the acoustic velocity layer.

5. The SAW device of claim 4, further comprising:
   a conductive layer coupled to a second surface of the piezoelectric layer, opposing the first surface of the piezoelectric layer.

6. The SAW device of claim 1, wherein the electrode has a mass that is provided by the first layer.

7. The SAW device of claim 1, wherein each electrode has a transduction center that is spatially offset from a reflection center of the electrode, and wherein the offset between the transduction center and the reflection center of each electrode in the wave propagation direction is equal to one-eighth of an operating wavelength of the SAW device.

8. The SAW device of claim 1, wherein the first width of the first layer is equal to one-quarter of an operating wavelength of the SAW device.

9. The SAW device of claim 1, further comprising:
   an acoustic velocity layer coupled to the piezoelectric layer at a first surface of the piezoelectric layer, the acoustic velocity layer having an acoustic velocity higher than that of the piezoelectric layer;
   wherein the transducer is coupled to the piezoelectric layer at a second surface of the piezoelectric layer, opposing the first surface of the piezoelectric layer.

10. The SAW device of claim 1, further comprising:
    a conductive layer coupled between the piezoelectric layer and an acoustic velocity layer, wherein the piezoelectric layer and the acoustic velocity layer are coupled to each other via the conductive layer, the acoustic velocity layer having an acoustic velocity higher than that of the piezoelectric layer.

11. The SAW device of claim 1 comprising two transducers, including an input transducer and an output transducer, the input transducer being configured to generate a SAW at an operating wavelength that propagates towards the output transducer in the wave propagation direction;
    wherein each electrode of the input transducer has a reflection center that is spatially offset from a transduction center of the electrode in the wave propagation direction by one-eighth of the operating wavelength; and
    wherein each electrode of the output transducer has a reflection center that is spatially offset from a transduction center of the electrode in a direction opposite to the wave propagation direction by one-eighth of the operating wavelength.

12. The SAW device of claim 1 comprising two transducers, including an input transducer and an output transducer, the input transducer being configured to generate a SAW at an operating wavelength that propagates towards the output transducer in the wave propagation direction;
    wherein the piezoelectric layer exhibits a difference in wave propagation properties between the wave propagation direction and a direction opposite to the wave propagation direction;
    wherein each electrode of the input transducer has a reflection center that is spatially coincident with a transduction center of the electrode; and
    wherein each electrode of the output transducer has a reflection center that is spatially offset from a transduction center of the electrode in a direction opposite to the wave propagation direction by one-half of the operating wavelength.

13. The SAW device of claim 1, wherein the conductive second layer is a graphene layer with the second thickness of 3 atomic layers.

14. The SAW device of claim 1, wherein the conductive first layer is a metal layer having a thickness in the range of 0.02-0.04 of an operating wavelength of the SAW device.

15. A method of fabricating a surface acoustic wave (SAW) device having a transducer with a plurality of electrodes, the plurality of electrodes being aligned with respective longitudinal axes parallel to each other and perpendicular to a wave propagation direction, the method comprising:
    forming a conductive second layer of an electrode on a substrate, the second layer having a second thickness that is thinner compared to a first thickness of a conductive first layer, the first layer comprising a metal layer, and the second layer comprising graphene or borophene having the second thickness of 3-10 atomic layers; and forming the conductive first layer of the electrode, the first layer being formed to have the first thickness and a first width in the wave propagation direction;

the first and second layers being formed to be in electrical contact with each other to provide electrical conduction over a total width of the electrode, the total width being in the wave propagation direction and being greater than the first width of the first layer.

16. The method of claim 15, wherein the second layer is formed before the first layer.

17. The method of claim 15, wherein the first layer is formed before the second layer, and wherein forming the first layer comprises:

etching the substrate; and forming the first layer in etched portions of the substrate.

18. The method of claim 15, wherein the substrate is an acoustic velocity layer, and wherein the method further comprises forming a piezoelectric layer over the electrode, the acoustic velocity layer having an acoustic velocity higher than the piezoelectric layer.

19. The method of claim 15, wherein the substrate is a piezoelectric layer.

20. The method of claim 15, wherein the electrode has a mass that is provided by the first layer.

21. The method of claim 15, wherein the second layer is formed to at least partially overlap with the first layer, and to be spatially offset from the first layer.

* * * * *